United States Patent [19]

Hu et al.

[11] Patent Number: 5,559,368
[45] Date of Patent: Sep. 24, 1996

[54] DYNAMIC THRESHOLD VOLTAGE MOSFET HAVING GATE TO BODY CONNECTION FOR ULTRA-LOW VOLTAGE OPERATION

[75] Inventors: Chenming Hu, Alamo; Ping K. Ko, Richmond; Fariborz Assaderaghi, Berkeley, all of Calif.; Stephen Parke, Poughkeepsie, N.Y.

[73] Assignee: The Regents of the University of California, Oakland, Calif.

[21] Appl. No.: 297,995

[22] Filed: Aug. 30, 1994

[51] Int. Cl.[6] .................................................. H01L 29/76
[52] U.S. Cl. ........................ 257/369; 257/351; 257/402; 327/328; 327/434
[58] Field of Search ................................. 257/347, 348, 257/349, 350, 351, 369, 384, 388, 402, 407, 412, 368; 327/328, 434

[56] References Cited

U.S. PATENT DOCUMENTS 5,272,432  12/1993  Nguyen et al. .................... 327/328

OTHER PUBLICATIONS

Colinge, Jean-Pierre, An SOI Voltage-Controlled Bipolar-MOS Device, IEEE Transactions on Electron Devices, vol. ED-34, No. 4, Apr. 1987, pp. 845-849.

Verdonckt-Vandebroek, Sophie, et al., High-Gain Lateral Bipolar Action in a MOSFET Structure, IEEE Trans. on Electron Devices, vol. 38, No. 11, Nov. 1991, pp. 2487-2495.

Parke, Stephen, et al., Bipolar-Fet Hybrid-Mode Operation of Quarter-Micrometer SOI MOSFETS, IEEE Electron Device Letters, vol. 14, No. 5, May 1993, pp. 234-236.

Assaderahi, Fariborz, et al., A Novel Silicon-on-Insulator (SOI MOSFET for Ultra Low Voltage Operation, 1994 IEEE Symposium on Low Power Electronics, Oct. 10-12, San Diego, CA, pp. 58-59.

Primary Examiner—Minhloan Tran
Attorney, Agent, or Firm—Townsend and Townsend and Crew; Henry K. Woodward

[57] ABSTRACT

A dynamic threshold voltage IGFET such as a MOSFET is operable at voltages of 0.6 volt or less. The threshold voltage of the transistor is reduced to zero volt or less by interconnecting the gate contact and the device body in which the voltage controlled channel is located. Several efficient connections using through hole plating or polycrystalline silicon gate extension are disclosed. A higher power supply voltage can be used by interconnecting the gate and device body through a smaller MOSFET.

2 Claims, 8 Drawing Sheets

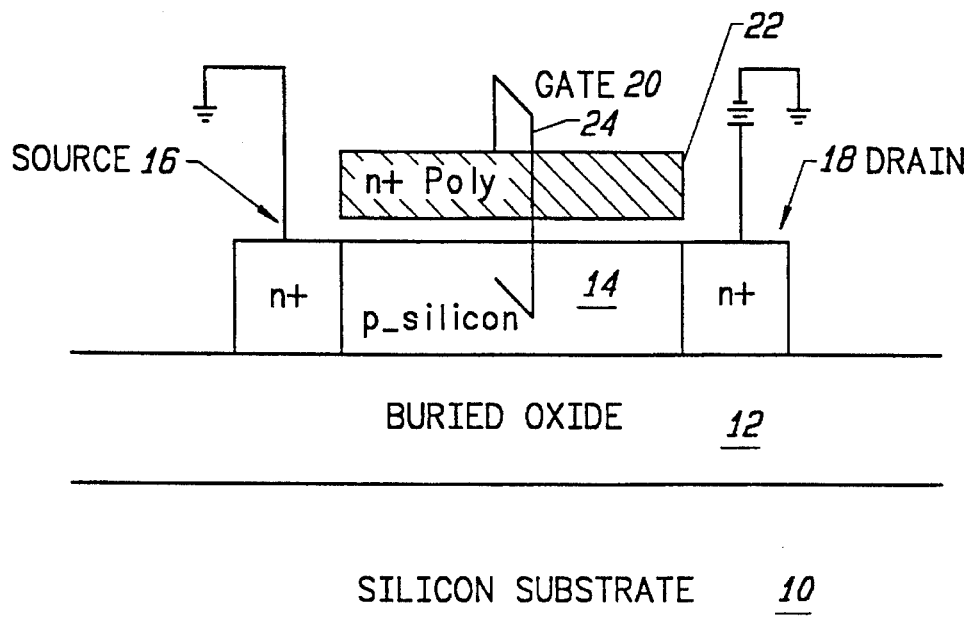
FIG. 1
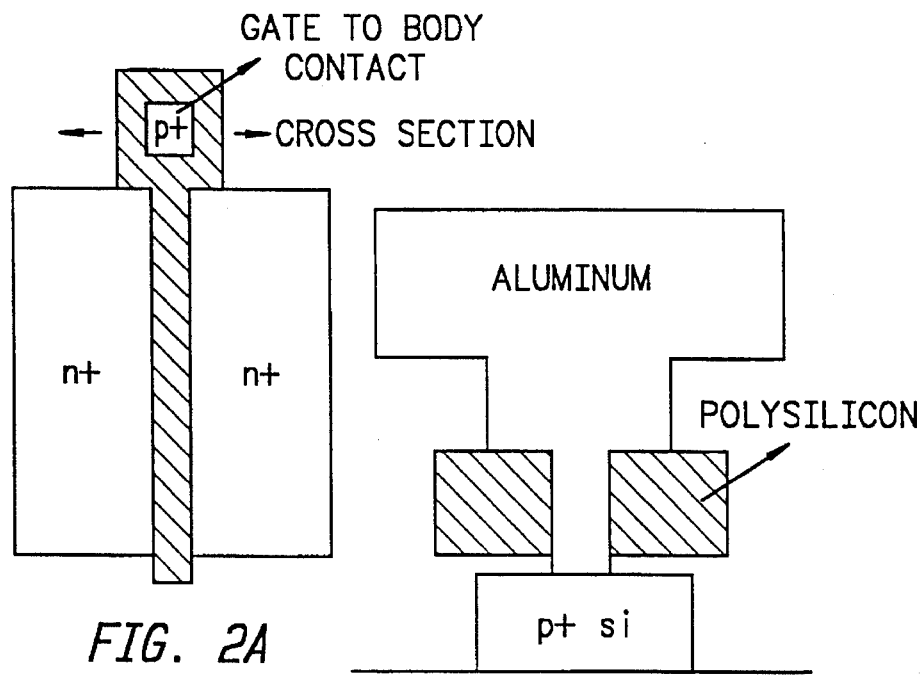
FIG. 2A
GATE TO BODY CONTACT CROSS-SECTION
FIG. 2B

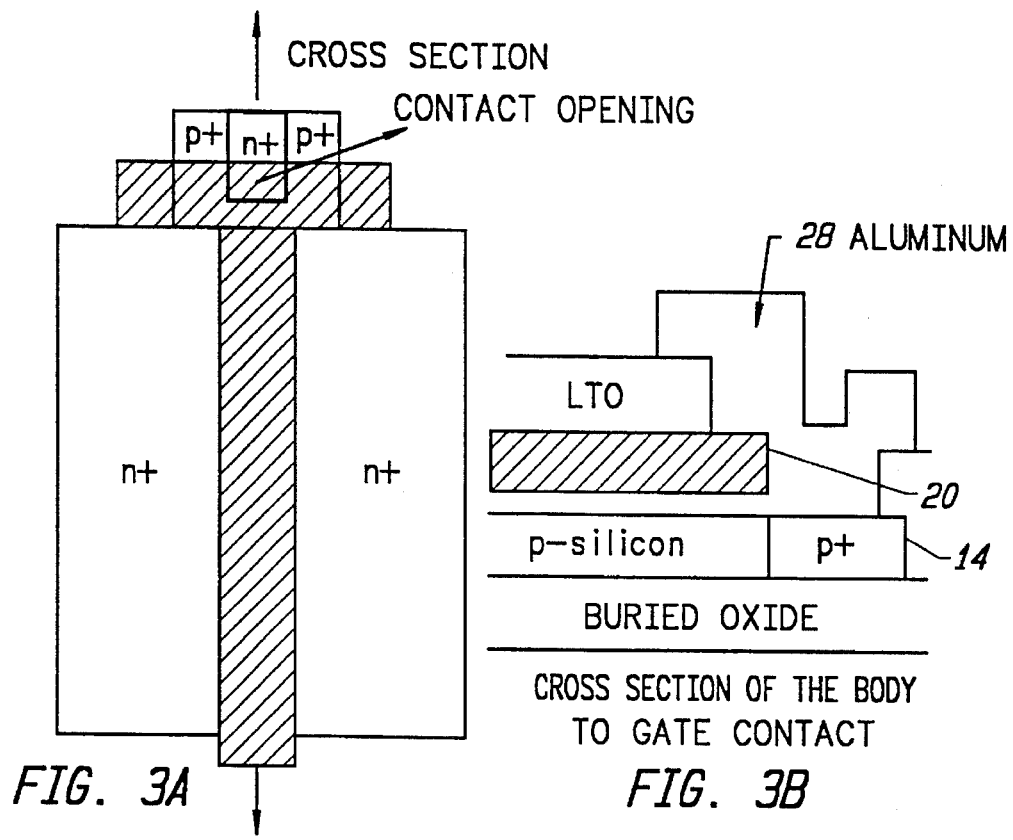
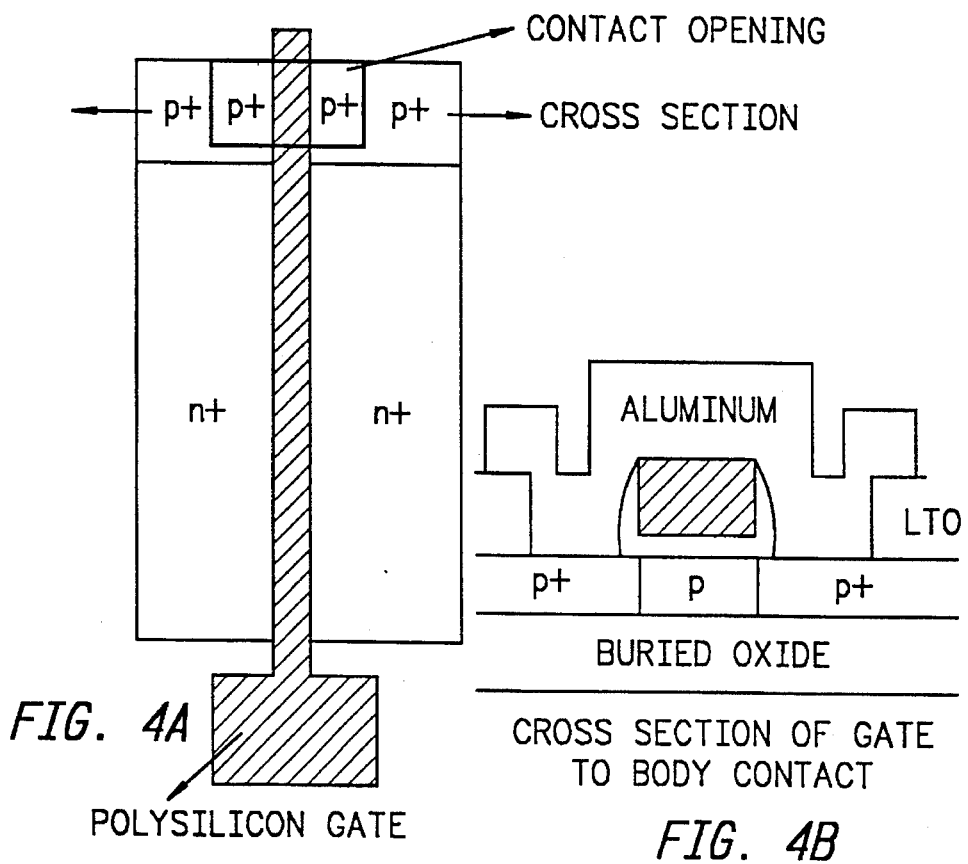

DYNAMIC THRESHOLD VOLTAGE MOSFET HAVING GATE TO BODY CONNECTION FOR ULTRA-LOW VOLTAGE OPERATION

This invention was made with Government support under Grant (Contract) No. F49620-93-C0014 awarded by the Air Force Office of Scientific Research/Joint Service Electronics Program. The Government has certain rights to this invention.

BACKGROUND OF THE INVENTION

This invention relates generally to insulated gate field effect transistors (IGFETs) such as MOSFET devices and integrated circuits, and more particularly the invention is directed to such devices and integrated circuits which can operate at an ultra-low voltage of 0.6 volt or less.

During the past few years, demand for high performance and low power digital systems has grown very rapidly. Several factors have contributed to this fast growth. First, laptop and notebook computers, and personal communication systems have gained popularity. Consequently, portable applications that traditionally required a modest performance (such as wrist watches and calculators) are now dominated by devices that demand a very high performance. The demand for portability of these new systems limits their weight and size, placing a severe constraint on their power dissipation. Second, speed, density and size of non-portable CMOS based systems have increased tremendously in recent years. Thus, power consumption, which was not a concern in these systems, now is becoming a critical parameter.

The main approach for reducing power has relied on power supply scaling. This is due to the fact that in CMOS digital circuits delivered power is proportional to the square of power supply voltage. Since power supply reduction below three times the threshold voltage ($3V_t$) will degrade circuit speed significantly, scaling of power supply should be accompanied by threshold voltage reduction. However, the lower limit for threshold voltage is set by the amount of off-state leakage current that can be tolerated (due to standby power consideration in static circuits, and avoidance of failure in dynamic circuits and memory arrays). It is seen that if regular MOSFETs are used, a lower bound for power supply voltage becomes inevitable.

Silicon-on-insulator (SOI) technology offers much promise for ultra large scale integrated circuits using sub-micron gate technology.. This technology employs a layer of semiconductor material overlying an insulation layer on a supporting bulk wafer. The structure can be formed by a number of well-known techniques, such as zone melting and recrystallization (ZMR), separation by implanted oxygen (SIMOX), and Bonded and Etchback (BESOI). Typically, the structure comprises a film of monocrystalline silicon on a buried layer of silicon oxide in a monocrystalline silicon substrate.

The bulk silicon material in which the channel of a MOSFET device is formed is typically grounded or connected to the source region of the device. However, in SOI MOSFETs the monocrystalline silicon film is often unbiased or floating. Heretofore, a SOI MOSFET has been operated as a lateral bipolar transistor by connecting the silicon film to the gate and exploiting the extra current produced by the device. However, this operation requires the body voltage to be larger than 0.6 volt. And since the current gain of the bipolar device is small, the extra drain (collector) current comes at the cost of excessive input (base) current, which contributes to standby current. This is contrary to a low-power operation.

SUMMARY OF THE INVENTION

In accordance with the invention, an IGFET such as a MOSFET formed in an SOI structure includes a gate to body connection to reduce turn-on voltage ($V_t$) and extend the lower bound of power supply voltage to an ultra-low level (i.e., 0.6 volt or less). The body contact can be provided by metal through a contact window in a polysilicon gate to the underlying film. Alternatively, the polysilicon gate can contact the silicon film directly through a contact window in the gate insulation. Also, separate contacts can be provided to the polysilicon gate, and to the body. These contacts can be shorted by the first-layer metal.

In another embodiment of the invention, an external bias generation circuit is provided so that the low threshold device can operate above 0.6 volt supply voltage. In this embodiment, a small field effect transistor provides forward body bias for a larger transistor. The small transistor limits the forward body bias to only 0.6 volt regardless of power supply voltage, thus $V_{dd}$ will no longer be limited to 0.6 volt. This embodiment is especially useful in circuits where large transistors are needed, such as in clock drivers and large buffers. The purpose of this connection is that the large transistor will have a much higher current drive than that of a regular transistor with the same size.

The invention and objects and features thereof will be more readily apparent from the following description and appended claims when taken with the drawings.

BRIEF DESCRIPTION OF THE DRAWINGS

FIG. 1 is a schematic representation of an SOI MOSFET in accordance with the invention.

FIGS. 2A and 2B are a top view and a side view in section of one embodiment of the invention.

FIGS. 3A, 3B are a top view and a side view in section of another embodiment of the invention.

FIGS. 4A, 4B are a top view and a side view in section of another embodiment of the invention.

DETAILED DESCRIPTION OF ILLUSTRATIVE EMBODIMENTS

Figure 5:
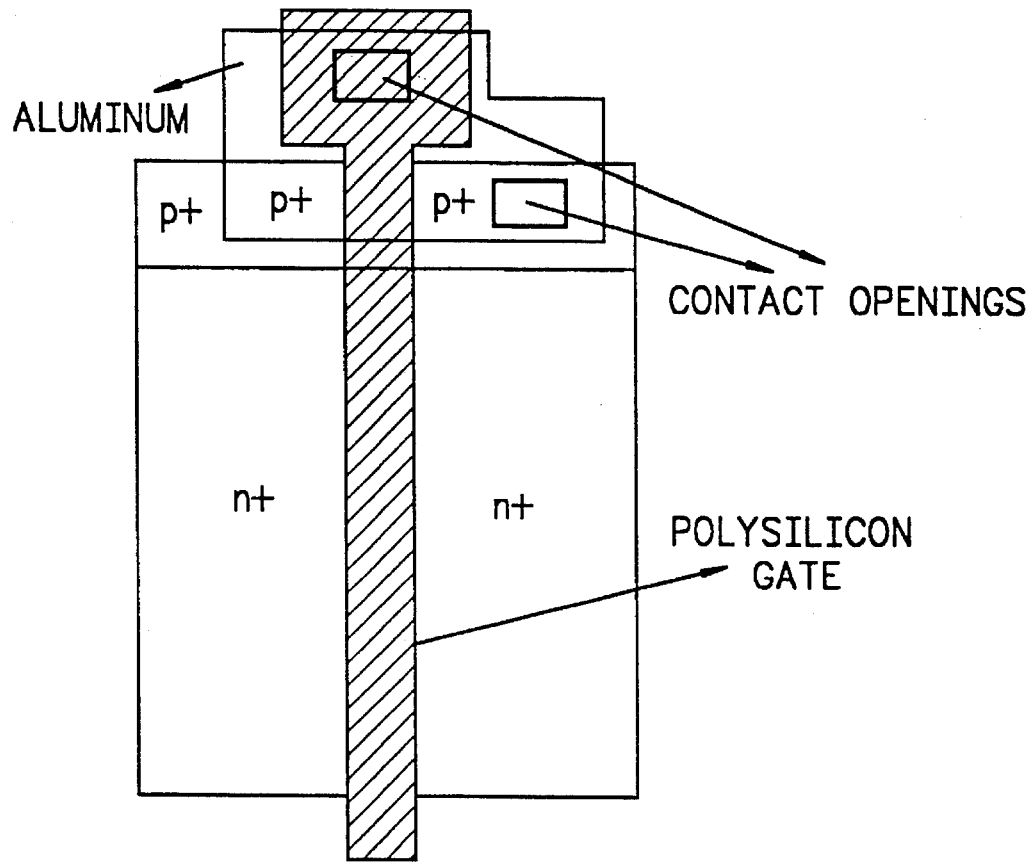
FIG. 5 is a top view of another embodiment of the invention.

Dynamic threshold MOS (DTMOS) devices in accordance with the invention have been fabricated on Silicon-On Insulator (SOI) substrates. Mesa active islands (MESA) were created by plasma-etching a nitride/oxide/silicon stack stopping at buried oxide. P+ polysilicon gate was used for PMOSFETs and N+ for NMOSFETs. Oxygen plasma "ashing" was done to the gate photoresist to achieve effective channel length down to 0.2 μm. A four-terminal layout was used to provide separate source, drain, gate, and body contacts. In addition to the four-terminal layout, devices with local gate-to-body connections were also fabricated as illustrated in FIG. 1 and FIG. 2.

In FIGS. 1 and 2, monocrystalline silicon substrate 10 has a buried oxide layer 12 formed therein with P− silicon film 14 on layer 12. N+ source 16 and N+ drain 18 are formed in film 14 with a gate electrode 20 formed over gate insulation 22 and the channel region between source 16 and drain 18. Gate 20 and film 14 are interconnected by connection 24. For NMOS, this connection uses an oversized metal-to-P+ contact window aligned over a "hole" in the poly gate. The metal shorts the gate and the P+ region. This ensures that the body-to-gate connection does not come at the expense of a significantly larger device area. A similar structure is used for PMOS device except that the P+ region is replaced by an N+ region.

Other connection methods that rely on metal shorting the polysilicon gate to the body are illustrated in FIGS. 3, 4, and 5. Like elements in FIGS. 1–7 have the same reference numerals. In the regions where polysilicon gate will be connected to the body, an oxide thicker than the gate oxide may be used to minimize the overlap capacitance. Specifically, in FIGS. 2–5, this region corresponds to the area where polysilicon is next to or over the P+ silicon film.

Figure 6:
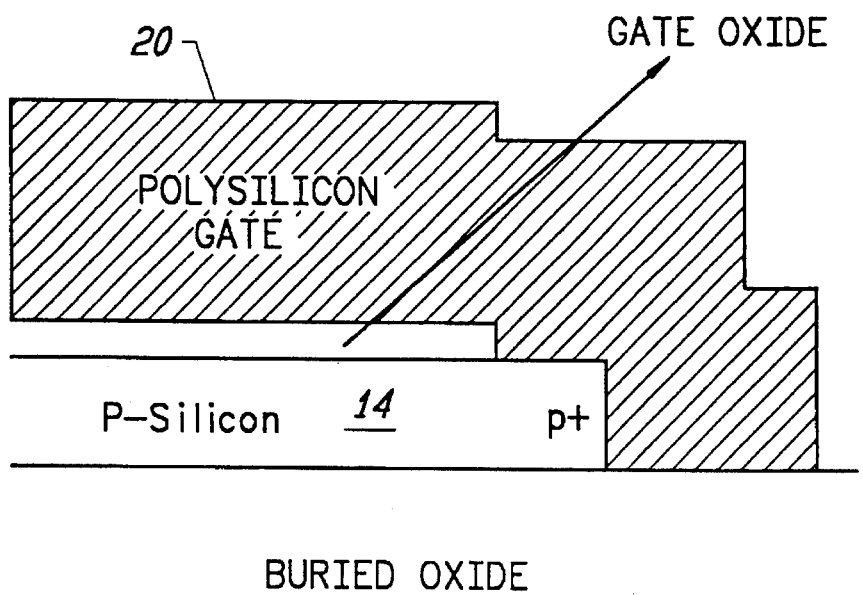
FIG. 6 is a side view in section of another embodiment of the invention.
Figure 7:
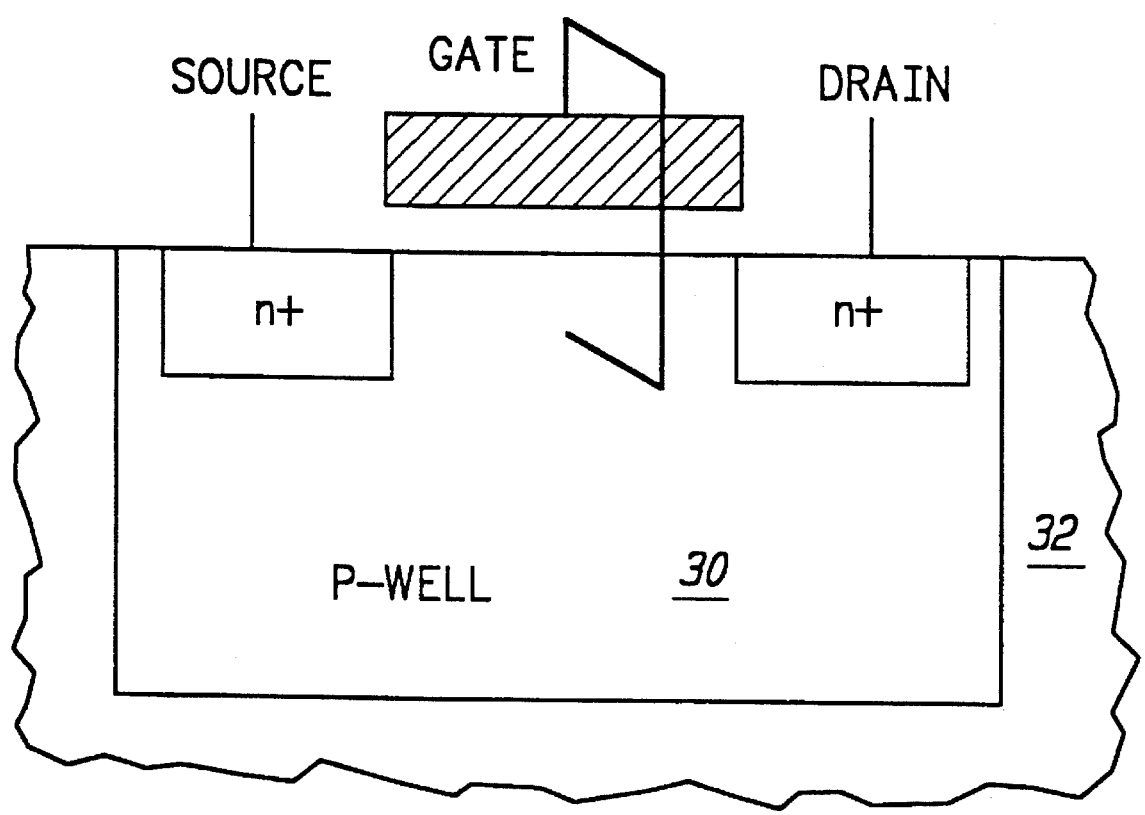
FIG. 7 is a schematic representation of the invention embodied in a conventional bulk device.

In FIG. 3, a metal contact 28 overlaps the gate contact 20 and an exposed portion of silicon film 14 extending beyond an edge of gate contact 20. In FIG. 6, doped polysilicon gate contact 20 extends into contact with an exposed portion of silicon film 14.

It is not necessary to use metal for shorting the body to the gate, as a buried contact can be exploited, as illustrated in FIG. 6. After gate oxidation, a thin layer of polysilicon (approximately 20 nm–30 nm) is deposited. Next, a new mask is used to make a contact window by etching the polysilicon layer and the underlying oxide in the selected area. Subsequently, a thick layer of polysilicon is deposited. This polysilicon layer will be shorted to the silicon film directly in the contact window. Obviously, the silicon region where the contact is made has to be doped P+ (as shown in FIG. 6), so that an ohmic contact to the body is formed.

In the DTMOS in accordance with the invention, the floating body and the gate of the Silicon-On-Insulator (SOI) MOSFET are tied together. A large improvement over regular MOSFET can be achieved when gate and body voltages are kept below 0.6 V. This also ensures that base current will stay negligible. The same idea can be used in bulk devices by connecting a p doped well 30 in monocrystalline silicon substrate 32 to the gate 20, illustrated in FIG. 7. However, particular advantage is realized in SOI, where base current and capacitances are appreciably reduced because of very small junction areas. The data presented here pertain only to the SOI devices.

Figure 8:
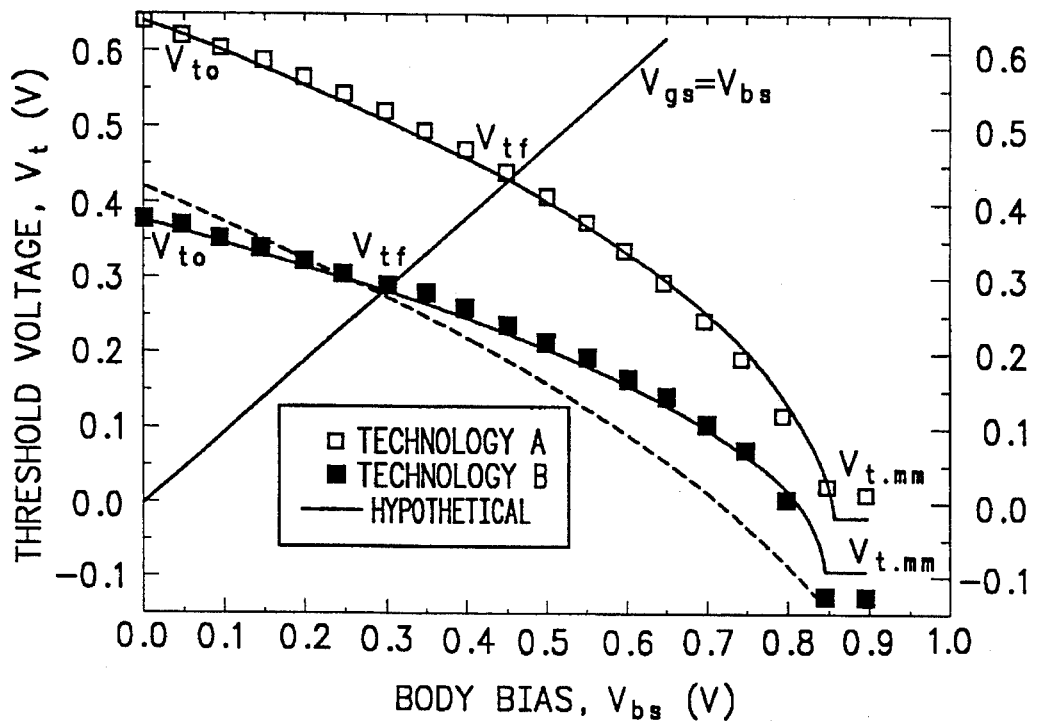
FIG. 8 is a plot of threshold voltage of an SOI NMOSFET as a function of body-source forward bias.

FIG. 8 illustrates the NMOS behavior, with a separate terminal used to control the body voltage. The threshold voltage at zero body bias is denoted by $V_{to}$. Body bias effect is normally considered in the reverse bias regime, where threshold voltage increases as body-to-source reverse bias is made larger. DTMOS is operated in the exact opposite regime. Namely, we "forward bias" the body-source junction (at less than 0.6 V), forcing the threshold voltage to drop.

Figure 9:
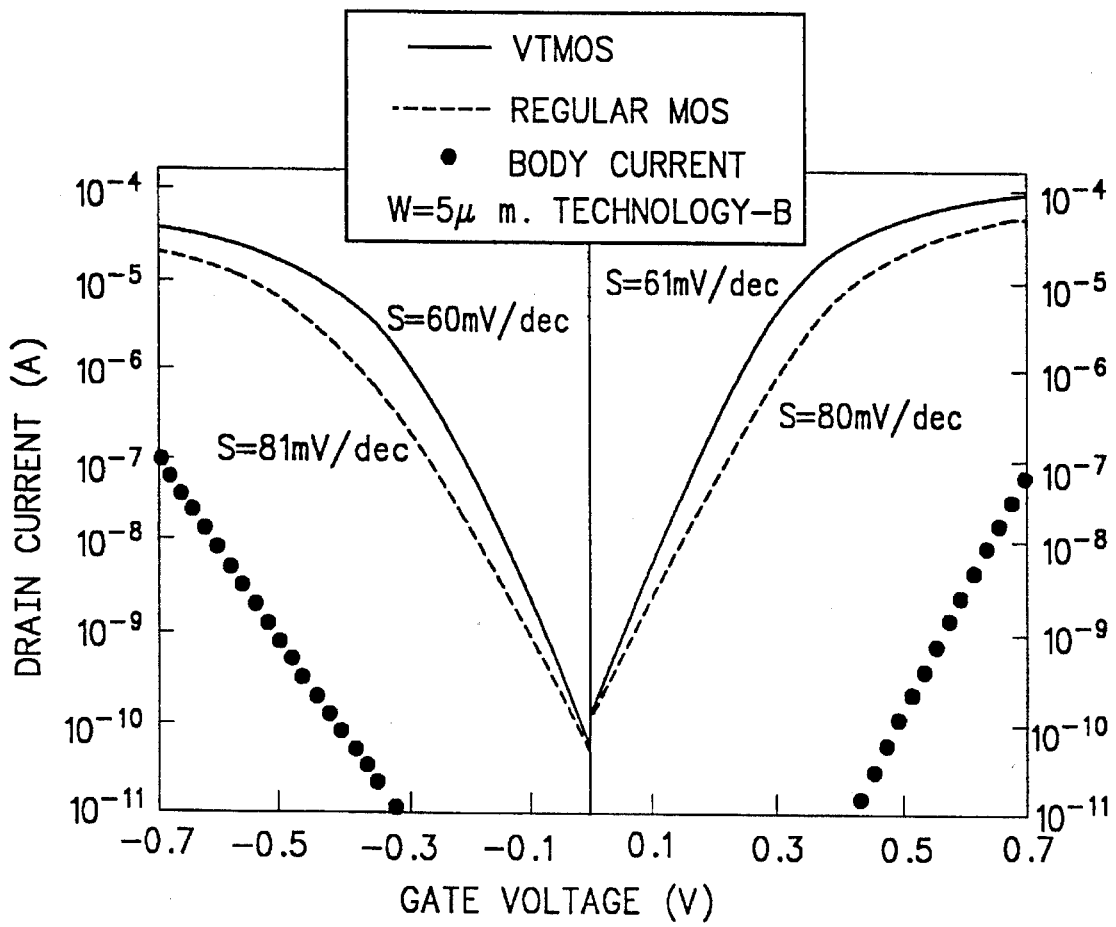
FIG. 9 is a plot of subthreshold characteristics of SOI NMOSFET and PMOSFET with body grounded and body tied to the gate.

Specifically, this forward bias effect is achieved by connecting the gate to the body. This is shown as the $V_{gs}=V_{bs}$ line in FIG. 8. In FIG. 8, Technology-A has $T_{ox}=10$ nm, $Na=2.0\times10^{17}$ cm$^{-3}$ and for Technology-B $T_{ox}=6.4$ nm and $Na=2.3\times10^{17}$ cm$^{-3}$. A hypothetical case with $Na=6\times10^{17}$ cm$^{-3}$ and $V_{fb}=-1.25$ V is shown as the dashed line. The intersect of the $V_t$ curve and the $V_{gs}=V_{bs}$ line determines the point where gate and threshold voltages become identical. This point, which is marked as $V_{tf}$, is the DTMOS threshold voltage. This lower threshold voltage does not come at the expense of higher off-state leakage current, because at $V_{bs}=V_{gs}=0$, DTMOS and a conventional device have the same $V_t$. In fact, they are identical in all respects and consequently have the same leakage. This is clearly seen in FIG. 9. Reduced $V_{tf}$ compared to $V_{to}$ is attained through a theoretically ideal subthreshold swing of 60 mV/dec. FIG. 9 demonstrates this for PMOS and NMOS devices operated in DTMOS mode and in regular mode. Subthreshold swing is 80 mV/dec in the regular devices. The ideal 60 mV/dec swing in DTMOS is achieved due to the fact that gate (body) voltage is directly applied to the body, rather than being capacitively coupled.

This is not the only improvement. As the gate of DTMOS is raised above $V_{tf}$, threshold voltage drops further. The threshold voltage reduction continues until $V_{gs}=V_{bs}$ reaches $2\Phi_b$, and threshold voltage reaches its minimum value of $V_{t,min}=2\Phi_b+V_{fb}$. For example, for technology-B in FIG. 8, at $V_{gs}=V_{bs}=0.6$ V, $V_t=0.18$ V compared to $V_{to}=0.4$ V. We have included models fitting the experimental data in FIG. 8. To obtain the sharpest curve (and hence the maximum $V_t$ reduction), the highest acceptable channel doping should be used. $V_{tf}$ then can be adjusted to the desired value by a gate material that gives large and negative flat band voltage. A hypothetical case demonstrating this concept is shown in FIG. 8, with doping=$6\times10^{17}$ cm$^{-3}$ and $V_{fb}=1.25$ V. Materials with work functions in the range of 3.4 eV–3.8 eV such as magnesium will be suitable for the gate. A gate material with a small work function ($\leq 4.1$ EV) should be used with NMOSFETs and gate material with a large work function ($\geq 5.1$ EV) should be used for PMOSFETs. Magnesium (3.7 EV) and platinum (5.6 EV) are examples.

Figure 10:
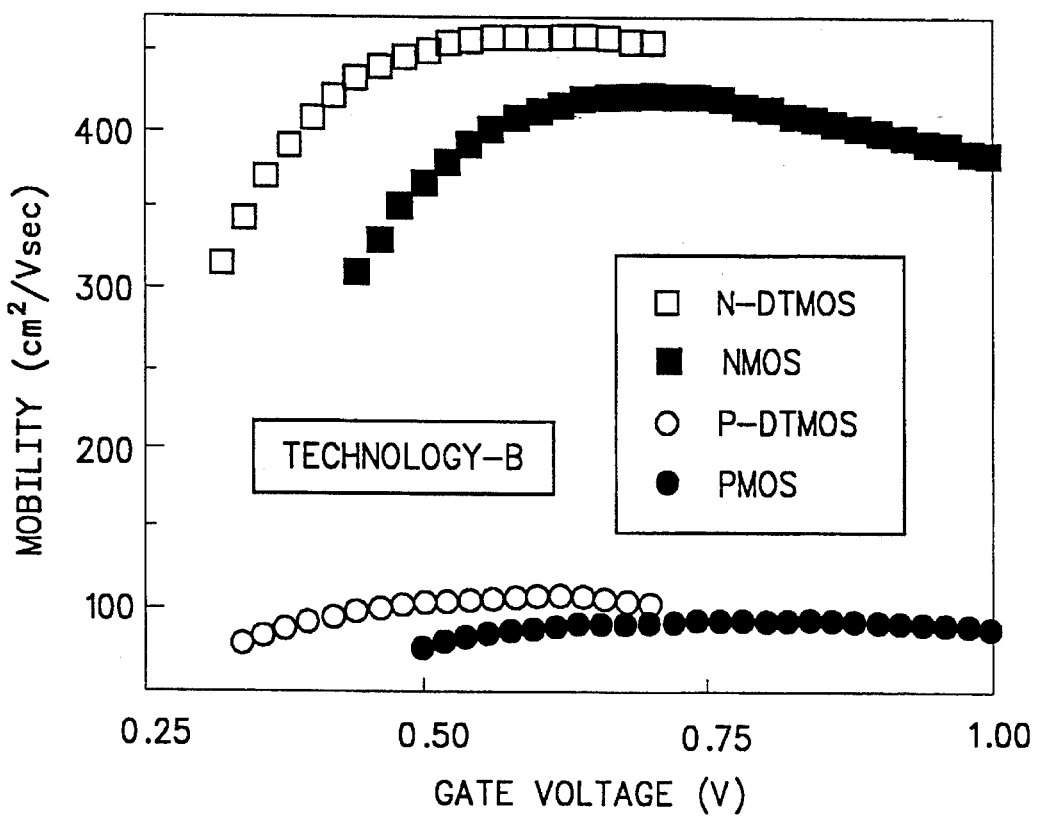
FIG. 10 is a plot of mobility for a DTMOSFET and for a conventional MOSFET.

In DTMOS operation, the upper bound for applied $V_{gs}=V_{bs}$ is set by the amount of base current that can be tolerated. This is illustrated in FIG. 9, where PMOS and NMOS device body (base) currents are shown. At $V_{gs}=0.6$ V, base currents for both PMOS and NMOS devices are less than 2 nA/μm. A further advantage of DTMOS is that its carrier mobility is higher because the depletion charge is reduced and the effective normal field in the channel is lowered. This is illustrated in FIG. 10.

Figure 11:
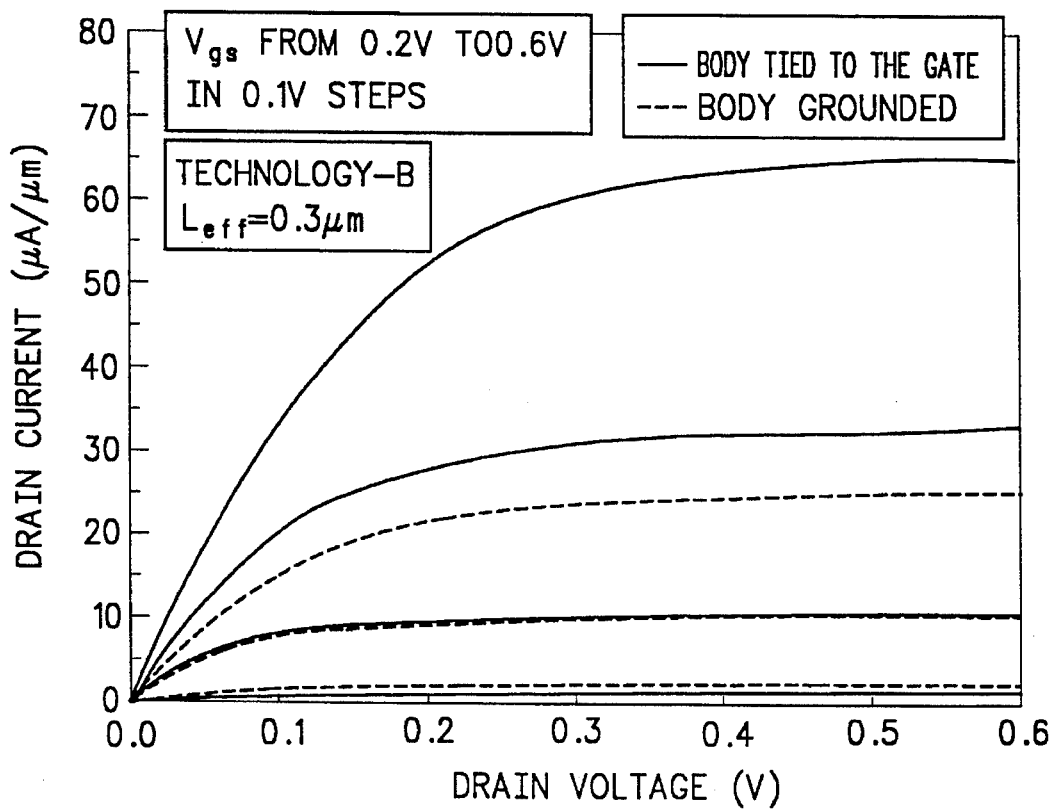
FIG. 11 is a plot of drain current of an SOI NMOSFET operated as a DTMOSFET and as a conventional MOSFET.

Current drives of DTMOS and regular MOSFET are compared in FIG. 11, for technology-B of FIG. 8. DTMOS drain current is 2.5 times that of the regular device at $V_{gs}=0.6$ V, and 5.5 times that of the regular device at $V_{gs}=0.3$ V.

Figure 12:
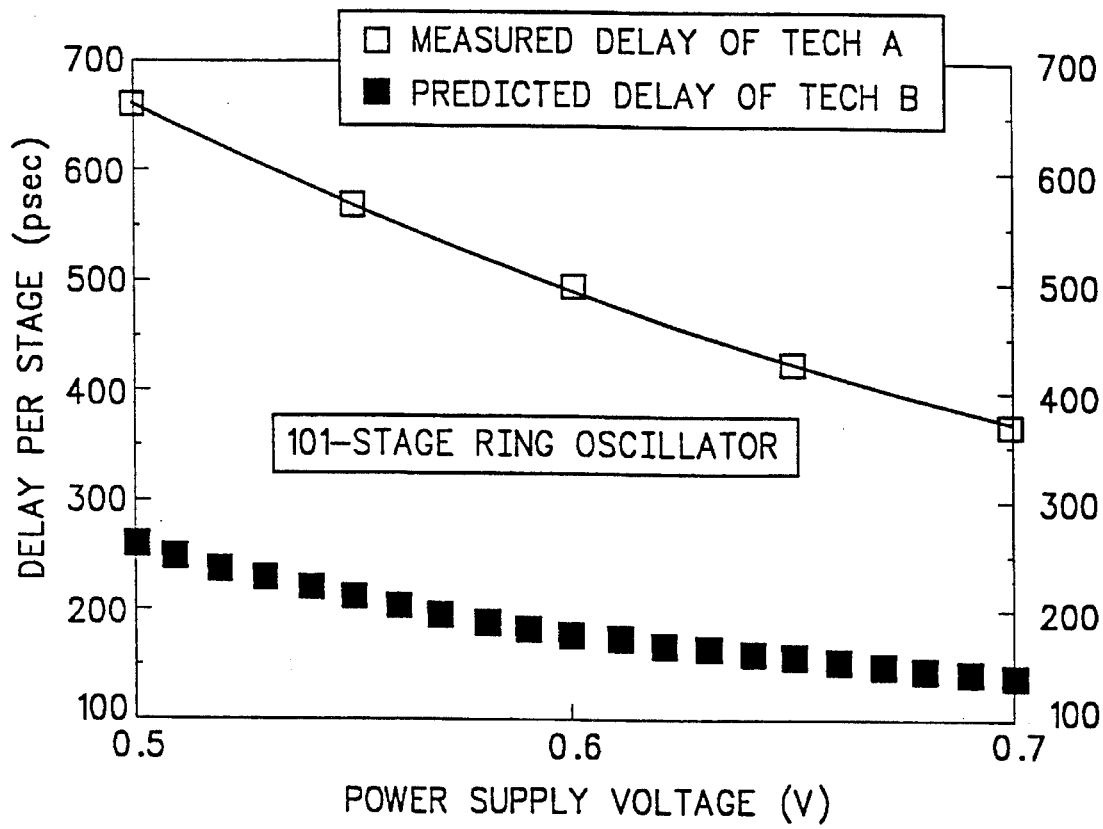
FIG. 12 is a plot of delay of a 101-stage ring oscillator with the PMOS and NMOS devices in the ring being DTMOS with $T_{ox}$=10 nm, Leff=0.3 µm, and $V_{to}$=0.6V.

To further illustrate the suitability of DTMOS for ultra low voltage operation, 101-stage ring oscillators were fabricated using technology-A. FIG. 12 plots the delay of each stage versus power supply. We emphasize that since the threshold voltage of devices used in the ring oscillator were high (technology A), the optimum performance was not achieved. For technology-B, ring oscillators are not available. If the devices based on technology-B are used, the expected delay for the unloaded ring oscillator can be calculated by the following equation:

$$\tau_{pd} = \frac{C}{4} V_{dd} \left( \frac{1}{I_{dsatn}} + \frac{1}{I_{dsatp}} \right).$$

Figure 13:
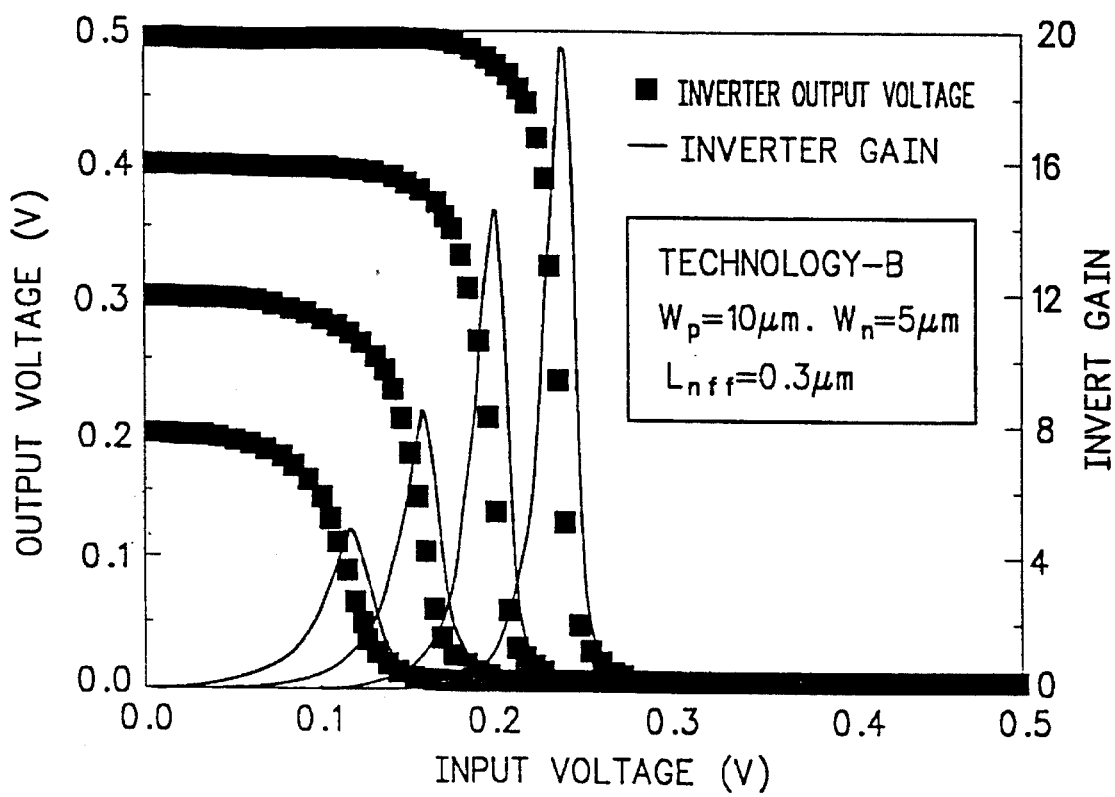
FIG. 13 is a plot of DTMOS inverter DC transfer characteristics.

This is shown as solid squares in FIG. 12, where C=200 fF is used for $W_n$=5 μm and $W_p$=10 μm. This value for C was obtained by fitting the equation to the measured $\tau_{pd}$ of technology-A. The inverter DC transfer characteristics for technology-B is shown in FIG. 13. If we adopt the criteria of noise margin being at least 0.2 $V_{dd}$, and inverter gain being at least 4, this inverter will stay operational down to $V_{dd}$=0.2 V.

Figure 14:
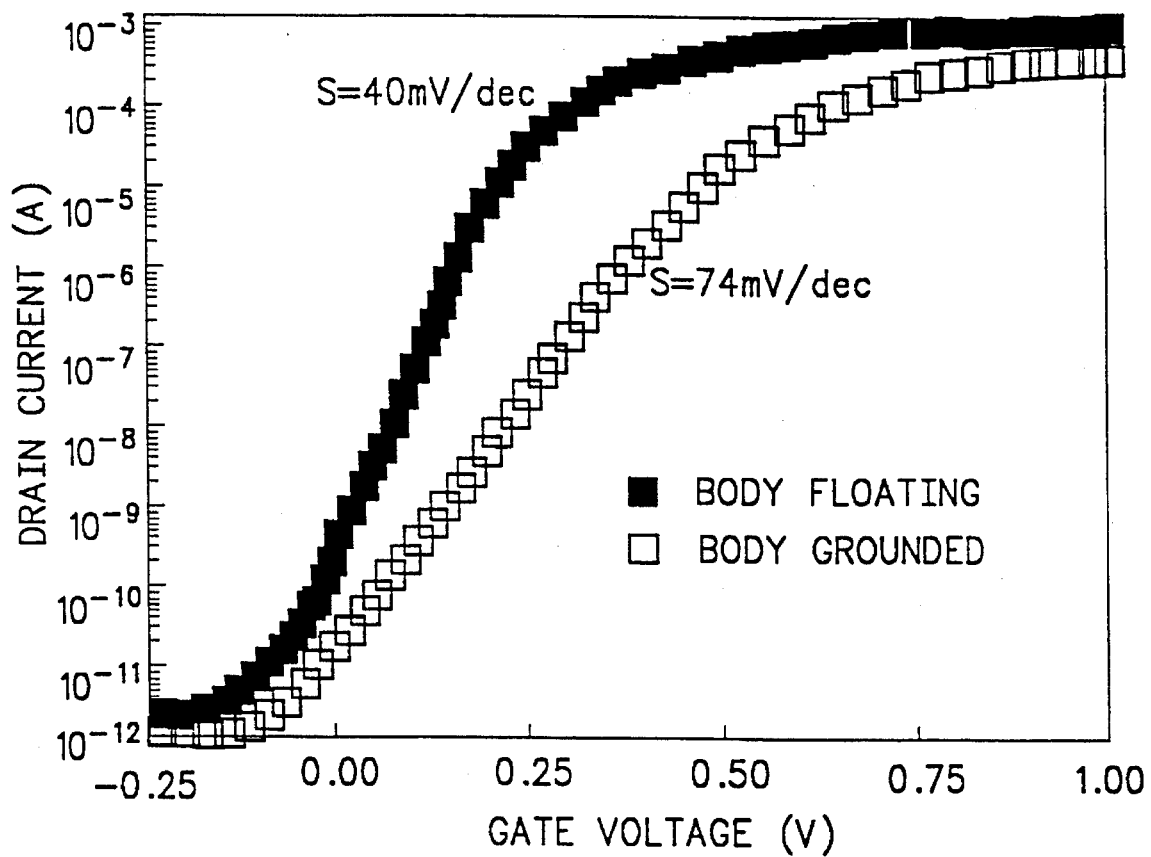
FIG. 14 is a plot comparing floating and grounded body SOI MOSFETs.

The invention relies on providing the body bias externally, i.e., using the gate voltage to forward bias the body. It is possible to use a self generation scheme to forward bias the body. When the device is ON, as the drain voltage is increased, the impact ionization current can forward bias the source-body junction. More specifically, the minority carriers generated by impact ionization accumulate at the back interface and form a equi-potential plane. Equilibrium is obtained when the number of carriers entering the body equals to that leaving the body via the forward-biased source/body diode. This will lead to a significantly reduced subthreshold swing, and lower threshold voltage. Thus, current drive of the device will be enhanced when $V_{gs}=V_{dd}$ and $V_{ds}=V_{dd}$. The threshold voltage reduction will not occur when the device is OFF, i.e., $V_{gs}$=0, because drain current will be small and impact ionization current will be negligible. FIG. 14 illustrates the self-generation of forward bias in a SOI MOSFET. This device has a four-terminal layout, with a separate body contact. We have compared the floating body against the grounded body configuration. As seen, in the floating body case, subthreshold swing is reduced and higher current drive is achieved. A similar idea can be exploited in a bulk device if the well is left floating.

Figure 15:
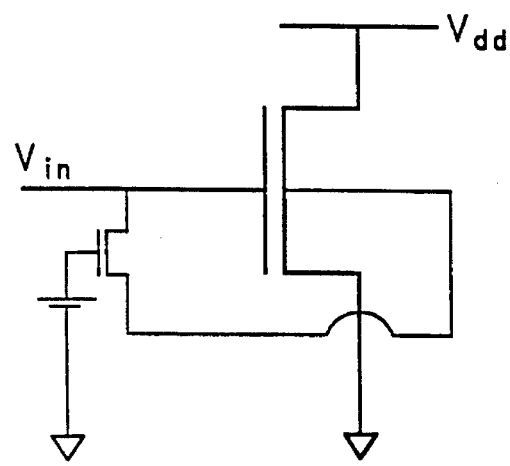
FIG. 15 is a schematic of an alternative embodiment of a DTMOS device.

When the device body is tied directly to the gate, power supply voltage will be limited to about 0.6 V or less. To remove this limitation, an external bias generation circuit as illustrated in FIG. 15 includes a small transistor 30 to provide the forward body bias for a large transistor 32 formed in a first semiconductor body region. The small transistor 30 is formed in a second semiconductor body region limits the forward body bias to only 0.6 V regardless of power supply voltage, thus $V_{dd}$ will no longer be limited to 0.6 V. The small transistor can be depletion-mode type or enhancement-mode type, with an appropriate gate voltage. This gate voltage can in fact be designed to be zero, so no extra power supply might be needed. The above scheme works particularly well for circuits where large transistors are needed, such as in clock drivers and large buffers. The small transistor adds negligible overhead, but provides significant current drive improvement for the large MOSFET.

There has been described several embodiments of a VTMOS device in accordance with the invention. While the invention has been described with reference to the several embodiments, the description is illustrative of the invention and is not to be construed as limiting the invention. Various modifications and applications might occur to those skilled in the art without departing from the true spirit and scope of the invention as defined by the appended claims.

What is claimed is:

1. A dynamic threshold insulated gate field effect device comprising a first transistor formed in a first semiconductor body region and having a source, a drain, a channel region between said source and said drain, and a gate contact overlying said channel region, a second transistor formed in a second semiconductor body region and having a source, a drain, a channel region between said source and said drain, and a gate contact overlying said channel region, means for interconnecting said drain of said second transistor to said gate of said first transistor, means for interconnecting said source of said second transistor to said first semiconductor body region, means for interconnecting said source of said first transistor to a reference potential, and means for biasing said gate contact of said second transistor with an appropriate gate voltage whereby said second transistor applies a forward bias to said first semiconductor body region relative to said source of said first transistor.

2. The device as defined by claim 1 wherein said first transistor is larger than said second transistor.

* * * * *